United States Patent
Bradley

(10) Patent No.: US 8,305,115 B2
(45) Date of Patent: Nov. 6, 2012

(54) ELIMINATION OF FRACTIONAL N BOUNDARY SPURS IN A SIGNAL SYNTHESIZER

(75) Inventor: Donald Anthony Bradley, Morgan Hill, CA (US)

(73) Assignee: Anritsu Company, Morgan Hill, CA (US)

( * ) Notice: Subject to any disclaimer, the term of this patent is extended or adjusted under 35 U.S.C. 154(b) by 208 days.

(21) Appl. No.: 12/790,460

(22) Filed: May 28, 2010

(65) Prior Publication Data

US 2011/0291706 A1    Dec. 1, 2011

(51) Int. Cl.
*H03B 21/00* (2006.01)

(52) U.S. Cl. .......................... 327/105; 327/156

(58) Field of Classification Search ............... 327/105, 327/107, 147, 150, 156, 159
See application file for complete search history.

(56) References Cited

U.S. PATENT DOCUMENTS

| | | | |
|---|---|---|---|
| 7,482,881 B2 * | 1/2009 | Chien | 331/16 |
| 7,538,622 B2 * | 5/2009 | Feng | 331/16 |
| 7,636,018 B2 * | 12/2009 | Chang et al. | 331/12 |
| 7,733,137 B2 * | 6/2010 | Feng | 327/156 |
| 7,884,675 B2 * | 2/2011 | Chien | 331/16 |
| 2007/0173207 A1 * | 7/2007 | Darabi | 455/76 |
| 2009/0121793 A1 * | 5/2009 | Chien | 331/16 |
| 2011/0121873 A1 * | 5/2011 | Chien | 327/156 |

* cited by examiner

*Primary Examiner* — Lincoln Donovan
*Assistant Examiner* — William Hernandez
(74) *Attorney, Agent, or Firm* — Fliesler Meyer LLP

(57) ABSTRACT

A portable frequency synthesizer is provided with fine tuning over a broad bandwidth using a Fractional N type Delta Sum Phase Locked Loop circuit that enables elimination of boundary value spurs. In the system, frequencies where spurs occur are calculated to define a region of fractional N values that cannot be used with a first time base. To avoid the boundary spurs, a second time base reference is selected that can generate boundary spurs that do not overlap with the first time base. Circuitry is provided to select the appropriate time base and the fractional N values to generate desired output frequencies throughout the synthesizer range while avoiding the boundary spurs.

12 Claims, 4 Drawing Sheets

$\triangle F_A$ = Acceptable Operational Range $\triangle F_F$ = Unacceptable Operational Range $\triangle F_{SP}$ = Spur Repeat Frequency $F_{REF}$ = Phase Detector Reference Frequency

ELIMINATION OF FRACTIONAL N BOUNDARY SPURS IN A SIGNAL SYNTHESIZER

BACKGROUND

1. Technical Field

The present invention relates to a fine resolution signal synthesizer that operates over a continuous frequency bandwidth using a Fractional N Delta Sum Phase Locked Loop.

2. Related Art

Traditional fine resolution synthesizers are made using one of three different techniques. The first is a Direct Synthesis technique that includes a phase locked loop that provides frequency adjustment using one of a sum, difference, multiply or a divide component. The second is a Direct Digital Synthesis (DDS) technique that creates and varies the output frequency using digital techniques. The third is a Delta Sigma approach, also know as a Fractional N Delta Sum Phase Locked Loop.

The size and power requirements for synthesizers using the first and second techniques, Direct Synthesis and DDS respectively, make those devices undesirable for use as a portable component for field testing over a desired test frequency range. The third technique, the Fractional N approach, is more ideal for creation of a portable device due to its limited size and power requirements for the same frequency range. A major drawback of this Fractional N approach, however, is a phenomenon called boundary spurs. Boundary spurs are spurious discrete frequencies that occur at particular frequency division values relative to the set time base provided in the phase locked loop. The boundary value spurs typically occur at fractional frequency values of the selected frequency division time base that approach N/4, N/2, 3N/4 and N.

SUMMARY

Embodiments of the present invention enable elimination of boundary value spurs for a Fractional N type frequency synthesizer. Elimination of the boundary spurs enables the Fractional N type synthesizer to be more readily used as a portable synthesizer over a wide frequency range.

Embodiments of the invention are based on the fact that boundary spurs can be pushed out in frequency far enough to enable them to be rejected by the closed loop zero crossing loop bandwidth. The pushed out spurs still, however, imply that a range of fractional values cannot be used, reducing the usefulness of the synthesizer system. To avoid the pushed out boundary spurs, however, two separate time bases are used to create two different locations where the pushed out boundary spurs can occur.

To create the two time base system, embodiments of the invention first calculate if the division ratio will create a boundary spur within a user defined range in the phase locked loop bandwidth. If so, it then uses a second reference frequency or time base that requires a new division ratio. The new division ratio will give the desired output frequency while moving its boundary spurs out of the loop bandwidth of the first reference. The value of the second reference frequency is selected that will give a spurious free alternate division ratio for frequency division ratios causing spurs with the first reference.

In one embodiment, a calculation is made at every output frequency of the synthesizer to determine if a spur occurs. For instance, for a selected synthesizer output frequency, a calculation is made to determine if the fractional frequency division value used with a first time base reference will create a spur. If a spur is determined to occur, then the calculation is redone to determine new whole and fractional frequency division values for a second time base where the spur will not occur.

For circuitry to accomplish embodiments of the present invention, in a first embodiment two separate time base references are provided within a single phase locked loop. A switch separately connects the different time bases to the phase locked loop in the signal synthesizer. Either calculations or a lookup table are used to determine when boundary spurs occur using the first time base. The second time base is selected to prevent any overlap of boundary spurs. The switch and frequency selections are then controlled to connect to the second time base where boundary spurs occur using the first time base to effectively eliminate the spurs.

In another circuit embodiment two separate phase locked loops are provided, each with its own timebase. A switch then selects the output of the desired phase locked loop to avoid boundary spurs.

BRIEF DESCRIPTION OF THE DRAWINGS

Further details of the present invention are explained with the help of the attached drawings in which.

DETAILED DESCRIPTION

Figure 1:
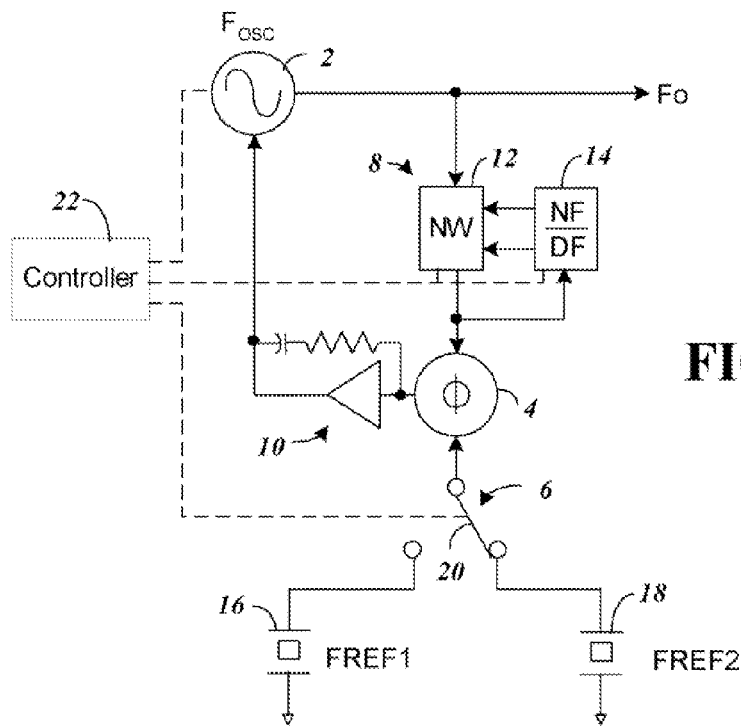
FIG. 1 shows a block diagram of components of a Fractional N Delta Sum Phase Locked Loop according to one embodiment of the present invention that allows selection between two time bases connected to a single phase locked loop.

FIG. 1 shows a block diagram of components of a Fractional N Delta Sum Phase Locked Loop with components according to one embodiment of the present invention that allows selection between two separate time bases 16 and 18. By providing a switch 20 to selectively connect one of the time bases 16 and 18, and by appropriately choosing the operating frequency of the time bases 16 and 18 boundary spurs can be avoided.

The phase locked loop of FIG. 1 is formed from a variable frequency signal source 2, phase detector 4, time base reference 6, frequency divider 8, and integrator 10. In operation, the phase locked loop phase detector 4 receives inputs from the time base frequency reference 6 and the signal source 2 through frequency divider 8. The output of the phase detector 4 through integrator 10 provides a voltage control signal to the signal source 2 to assure it is phase aligned with the time base reference 6.

For a fractional N type phase locked loop, the frequency divider 8 is made up of an N times frequency divider 12 as well as a fractional N divider 14 for fine tuning. The frequency divider 12 provides for a division by a whole number (NW)

representing Nwhole, and can be found in a typical phase locked loop that does not offer fine tuning. The second frequency divider 14 allows fine resolution tuning by adjusting both the numerator NF and denominator DF to provide NF/DF, or a fractional division represented as Nfrac=NF/DF. An example device that provides both the first Nwhole frequency divider 12 and the Nfrac frequency divider 14 is the Skyworks SKY72300 series fractional-N synthesizer. However, when using the fractional N type synthesizers boundary spurs can occur at values that are ¼ the time base reference frequency, namely where NF/DF=¼, ½, ¾, 1. The integrator 10 or other filter placed in the path of integrator 10 can attenuate the spurs, but do little to attenuate them within the loop bandwidth. Thus, typical designers do not use the fractional N type phase locked loops when a continuous tuning bandwidth is required. For instance, an Fo bandwidth of 1.5 to 3 GHz will likely allow use of the fractional N type device with boundary spurs in the range of −40 dBc. However, for a higher range from 13-40 GHz, the spurs will be increased in amplitude due to frequency multiplication to a level of 20×Log 40 GHz/3 GHz or +22.5 dB. The boundary spurs on the 40 GHz signal will now be in the −17.5 dBc range. This is unacceptable without use of embodiments of the present invention, so a lab grade instrument has previously not been available using the fractional N type device.

To enable recovering the unusable areas of the phase locked loop where spurs occur, two different time base oscillators are used in embodiments of the present invention. A selection is made between the two time base oscillators to avoid spurs. This creates a frequency synthesizer with a continuous frequency spectrum without boundary spurs that can be used up into the 40 GHz frequency range.

In a first embodiment of the present invention shown in FIG. 1, the time base reference 6 is constructed using two time base oscillators 16 and 18. Switch 20 selectively connects one of the time bases 16 and 18 to the phase detector 4 of the phase locked loop. The time base frequencies are selected to avoid the frequency spurs as discussed with respect to FIGS. 2A-2B and FIG. 3.

Figure 2A:
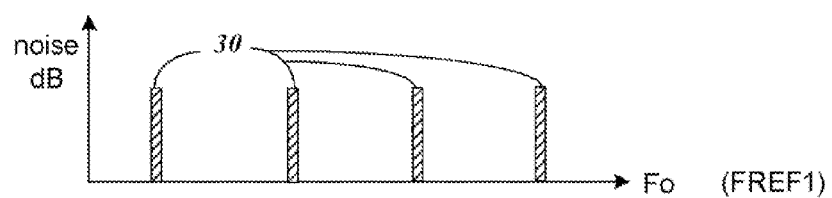
FIGS. 2A and 2B illustrate boundary spurs resulting from selection of two different frequency time base references.
Figure 2B:
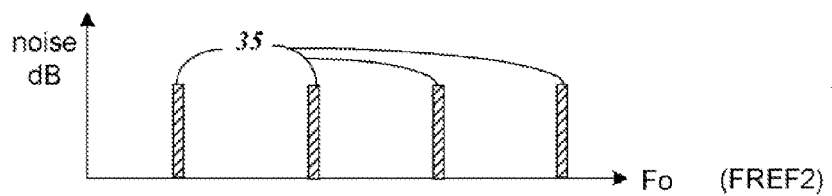

As shown in FIGS. 2A and 2B, the frequency FREF1 of the first time based oscillator 16 is selected to occur so that spurs 30 occur at different locations than the spurs 35 of oscillator 18 operating at FREF2. By using different FREF1 and FREF2 values and corresponding frequency division values (NW and NF/DF), the output frequency (Fo) boundary spurs 30 shown in FIG. 2A in hashed lines can be pushed over in frequency far enough to avoid spurs 35 in FIG. 2B to let the phase locked loop (entire circuit of FIG. 1) reject them. In one embodiment, the time base 16 is selected by switch 20, while the switch 20 is transitioned to connect time base 18 at frequencies where spurs 30 occur.

A controller 22 is programmed to control the switch 20, as well as the frequency division values NW and NF/DF in frequency dividers 12 and 14 to provide a range of frequencies Fo without encountering spurs. The controller can also vary the frequency $F_{OSC}$ of oscillator 2, which in exemplary circuitry can be set from 1.5-3 GHz. The controller can be a microprocessor, digital signal processor, or other control device that can store control software and provide signals to control external devices of the phase locked loop. Programming of the controller can be done to avoid frequency spurs while providing a desired frequency spectrum for the synthesizer output Fo.

Figure 3:
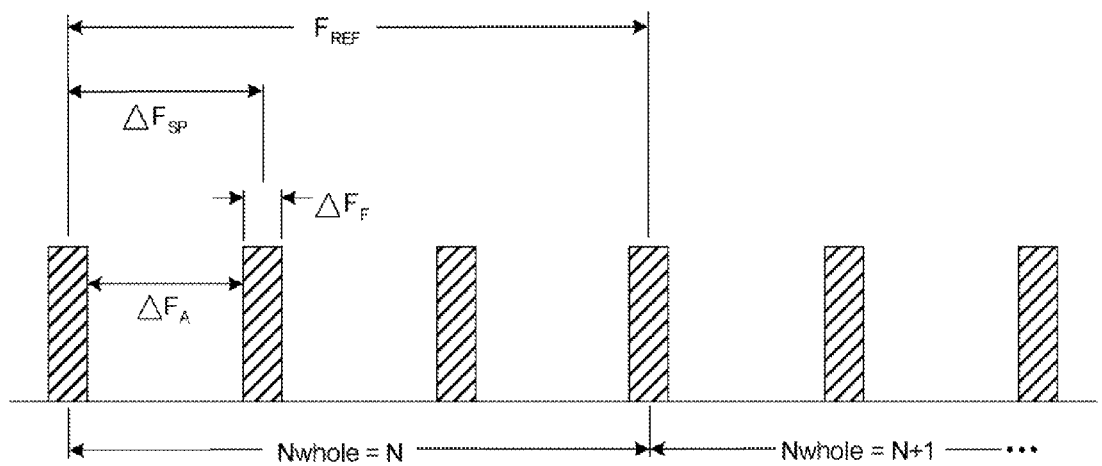
FIG. 3 illustrates frequency values that enable calculation of time base reference frequencies for pushing spurs out of range.

FIG. 3 illustrates how frequency values can be calculated to enable selection of time base reference frequencies, and other values for the circuit of FIG. 1 to push spurs out of range. First of all, the spurs are identified by hatched lines along an amplitude vs. frequency plot. The unacceptable operational range $\Delta F_F$ is the frequency range within the loop bandwidth where spurs will appear. The acceptable operation range is $\Delta F_A$. Spurs appearing in this range will be rejected by the loop bandwidth. The spurs are periodic, and the spur repeat frequency is $\Delta F_{SP}$. The time base reference frequency $F_{REF}$ is shown. Also as indicated, the frequency $F_{REF}$ is one integer value of Nwhole, with fractional values Nfrac differentiating frequency values within $F_{REF}$. Thus, the first $F_{REF}$ range is shown as Nwhole=N, the second is shown as Nwhole=N+1, and so forth.

Relations exist to identify desirable frequencies to enable selecting $F_{REF1}$ and $F_{REF2}$. First, the spur repeat frequency will be a multiple of ¼ of the reference frequency, $\Delta F_{sp}=F_{REF}/4$, as spurs occur periodically at ¼ intervals. The value $F_{REF}$ can be either the frequency $F_{REF1}$ of the time base 16, or $F_{REF2}$ of the time base 18. With switch 20 maintaining a base connection to time base 16 unless a spur is encountered, a first focus is on $F_{REF1}$. Since the acceptable frequency range $\Delta F_A=\Delta F_{SP}-\Delta F_F$, then $\Delta F_A=F_{REF1}/4-\Delta F_F$. The maximum value for N ($N_{MAX}$) used in divider 12 will be related to the maximum frequency of the oscillator 2, $Fosc_{MAX}$, as follows: $N_{MAX}=Fosc_{MAX}/F_{REF1}$. The value $N_{MAX}$ can then be used to determine $F_{REF2}$ relative to $F_{REF1}$ as follows: $F_{REF2}=F_{REF1}+\Delta F_A/N_{MAX}$. The minimum value of $N_{MIN}$ used in divider 12 can then be set based on the difference between the frequencies of time base references 16 and 18 as follows: $N_{MIN}=\Delta F_F/(F_{REF2}-F_{REF1})$ to assure the time bases are appropriately set.

In one example, calculation of values is performed so that $F_{REF1}$ and $F_{REF2}$ do not create overlapping spurs. For this example, assume $F_{REF1}$=26 MHz, arbitrarily set $\Delta F_F$=1 MHz, and let $F_{MAX}$=3 GHz. Then the following calculations can be performed:

$$\Delta F_{SP}=F_{REF1}/4=26 \text{ MHz}/4=6 \text{ MHz}$$

$$\Delta F_A=F_{sp}-\Delta F_F=F_{REF}/4-\Delta F_F=26/4 \text{ MHz}-1 \text{ MHz}=5 \text{ MHz}$$

$$N_{MAX}=Fosc_{MAX}/F_{REF}=115.3846 \text{ GHz}$$

$$F_{REF2}=F_{REF1}+\Delta F_F/N_{MAX}=26.0476 \text{ MHz}$$

$$N_{MIN}=\Delta F_F/(F_{REF2}-F_{REF1})=21.$$

Figure 4:
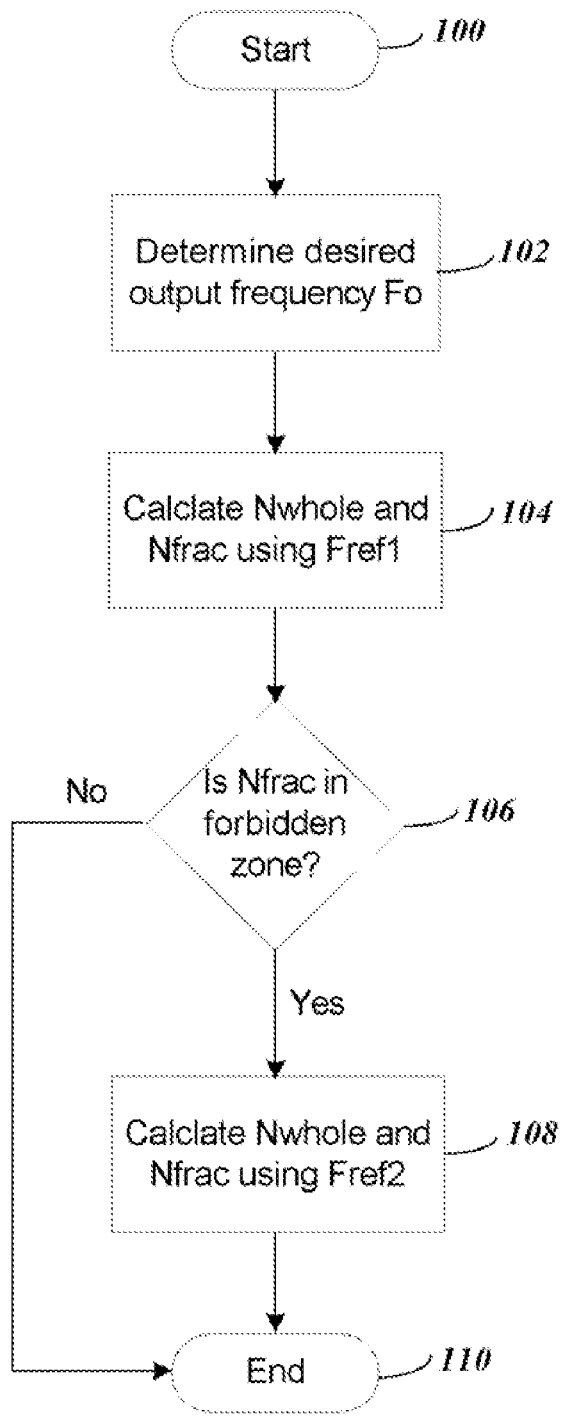
FIG. 4 is a flowchart illustrating a sequence of steps of a calculation to determine if a spur occurs, and if so calculating frequency division values to use with a second time base to avoid spurs.

FIG. 4 provides a flowchart illustrating a sequence of steps of a calculation to determine if a spur occurs with time base reference 16 that can be used with the controller 22, and if so calculating frequency division values to use with the second time base 18 to avoid spurs. After starting in step 100, the desired output frequency Fo is selected in step 102 and values for Nwhole and Nfrac are determined using $F_{REF1}$ of time base 16. In step 106 a determination is made if the Nfrac is in a forbidden zone that will create a spur. The determination in step 106 can be either calculated or identified in a look up table. If in step 106 Nfrac is not in a forbidden zone, the process proceeds to 110 to end with the Nwhole, Nfrac for $F_{REF1}$ being used. If in step 106 Nfrac is in the forbidden zone, the process proceeds to step 108 to determine Nwhole and Nfrac values using $F_{REF2}$ of time base 18 with either a calculation or look up table so that spurs do not occur. The process then proceeds from 108 to step 110 to use the values determined for $F_{REF2}$.

In one embodiment, a calculation is made at every desired output frequency of the synthesizer to determine if a spur occurs. For instance, for a selected synthesizer output frequency, a calculation is made to determine if fractional Nfrac frequency division value used with a first time base reference $F_{REF1}$ will create a spur. If a spur is determined to occur, then the calculation is redone to determine new whole Nwhole and fractional Nfrac frequency division values for the second time base $F_{REF2}$ where the spur will not occur. Instead of calculations each time, the values can likewise be read from a lookup table.

Figure 5:
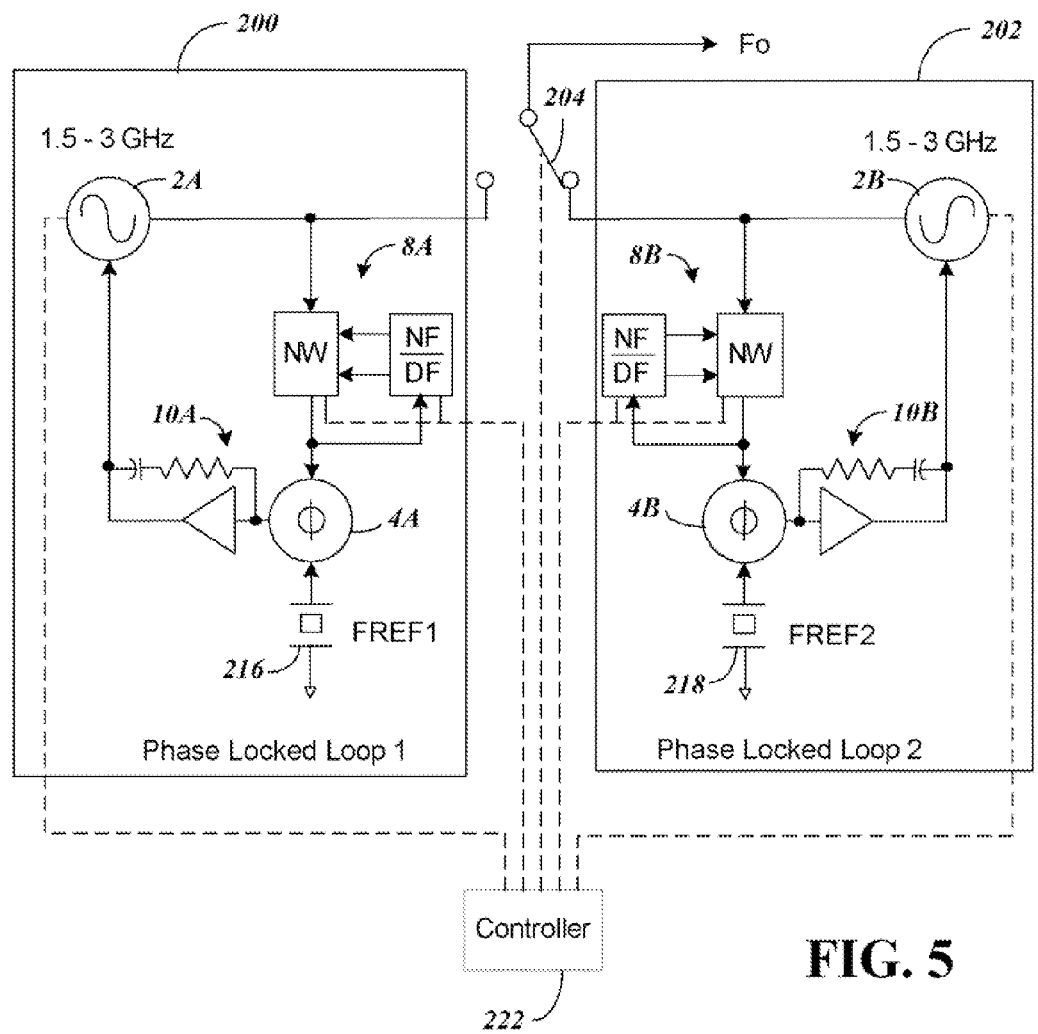
FIG. 5 shows a block diagram of components of a synthesizer system according to another embodiment of the present invention that allows selection between two phase locked loops, each having a different time base.

FIG. 5 shows a block diagram of components of a synthesizer system according to another embodiment of the present invention that allows selection between two phase locked loops, each having a different time base. The system includes two phase locked loops 200 and 202 with a switch 204 selectively providing the output Fo. The phase locked loops 200 and 202 each have components similar to those in the phase locked loop of FIG. 1, so the components of phase locked loop 200 that are similar are labeled with the same reference number with a version "A" afterward, and the components of phase locked loop 202 that are similar are labeled with the version "B." For example, the oscillator 2 of FIG. 1 is carried over as oscillator 2A in phase locked loop 200, and oscillator 2B in phase locked loop 202.

The difference between the phase locked loop of FIG. 1, and the phase locked loops 200 and 202 of FIG. 5 is that the switch 20 and time based references 16 and 18 of FIG. 1 are replaced by a single oscillator 216 in phase locked loop 200 and a single oscillator 218 in phase locked loop 202. Thus, instead of selecting between two time based references in a single phase locked loop in FIG. 1, the circuit of FIG. 4 selects between two separate phase locked loops, each with a different time base 216 or 218. The controller 222 in FIG. 5, similar to the controller of FIG. 1, allows control of the output frequency Fo so that spurs don't occur. The controller 222, thus, controls the switch 204, frequency dividers 8A and 8B, and oscillators 2A and 2B of both phase locked loops 200 and 202.

Although the present invention has been described above with particularity, this was merely to teach one of ordinary skill in the art how to make and use the invention. Many additional modifications will fall within the scope of the invention, as that scope is defined by the following claims.

What is claimed:

1. A method of reducing boundary value spurs in a signal synthesizer comprising:
   determining initial division ratios in a frequency divider for a phase locked loop driven by a first frequency reference source (FREF1) to enable the output (Fo) of the signal synthesizer to operate over a defined range of frequencies;
   identifying boundary spurs within the defined range of frequencies associated with a first set of division ratios in the initial division ratios to provide first frequencies in the output frequencies where boundary spurs do not occur;
   determining second division ratios for second frequencies in the defined range of frequencies where boundary spurs were identified using the initial division ratios, the second division ratios provided using a second frequency reference source (FREF2) operating at a different frequency than the first frequency reference source (FREF1) so that boundary value spurs do not occur; and
   controlling operation of the signal synthesizer over the defined range of frequencies so that the first frequency reference source (FREF1) and first division ratios are applied for the first frequencies, and the second frequency reference source (FREF2) and second division ratios are applied for the second frequencies.

2. The method of claim 1, wherein the first frequency reference source (FREF1) and second frequency reference source (FREF2) are selectively connected by a switch to a phase detector of a single phased locked loop to perform the controlling operation step.

3. The method of claim 1,
   wherein the first frequency reference source (FREF1) is provided in a first phase locked loop, and the second frequency reference source (FREF2) is provided in a second phase locked loop, and
   wherein the first phase locked loop and the second phase locked loop are connected by a switch to selectively provide the output (Fo) of the signal synthesizer to perform the controlling operation step.

4. The method of claim 1, wherein the initial division ratios are provided in a phase locked loop of the signal synthesizer by a series connected whole number frequency divider (NW) and a fractional number frequency divider (NF/DF).

5. The method of claim 1, wherein the initial division ratios are provided in a phase locked loop by a frequency divider (NF/DF) that allows changes in both a numerator and a denominator of a frequency division value of the frequency divider.

6. The method of claim 1, wherein the step of determining second division ratios comprises:
   choosing the second frequency reference source (FREF2) so that boundary value spurs in the output (Fo) do not overlap with boundary value spurs using the first frequency reference source (FREF1).

7. A method of controlling a signal synthesizer comprising:
   determining a first division ratio, including whole (Nwhole) and fractional (Nfrac) values for a phase locked loop driven by a first frequency reference source (FREF1), to enable the output (Fo) of the signal synthesizer to operate at a defined frequency;
   calculating to determine if boundary spurs occur at the defined frequency, and setting the first division ratio values and the first frequency reference source (FREF1) to provide the defined frequency output (Fo) for the signal synthesizer if the calculation indicates boundary spurs do not occur;
   determining a second division ratio, including new whole (Nwhole) and fractional (Nfrac) values for the defined frequency output (Fo) using a second frequency reference source (FREF2) so that boundary spurs do not occur when the calculating step indicates the boundary spur occurs for the first frequency reference source (FREF1), and setting the second ratio values and the second frequency reference source (FREF2) to provide the defined frequency output (Fo) of the signal synthesizer.

8. A phase locked loop system comprising:
   a voltage controlled signal source;
   a frequency divider having an input connected to an output of the voltage controlled signal source and providing an output;
   a phase detector having a first input connected to the output of the frequency divider, a second input, and an output connected to a phase control input of the voltage controlled signal source;
   a first time base frequency reference source;
   a second time base frequency reference source;
   a switch selectively connecting at least one of the first time base and the second time base to the second input of the phase detector; and
   a controller for selectively controlling the switch over a defined range of frequencies provided from the output of the voltage controlled signal source so that the first time base is connected for first frequencies of the range where boundary spurs do not occur, and the second time base is connected for second frequencies of the range where boundary spurs would occur if the first time base were connected, wherein the controller further controls a frequency division value provided by the frequency divider to prevent boundary spurs, the frequency division value having both a whole component (Nwhole) and a fractional component (Nfrac).

9. The phase locked loop system of claim 8, wherein the whole component (Nwhole) and the fractional component (Nfrac) are different values when the first and second time base frequency reference sources are used to provide the same output frequency provided from the phase locked loop system.

10. A signal synthesizer comprising:

two phase locked loops, each phase locked loop comprising:
- a voltage controlled signal source having an output form an output of the phase locked loop;
- a fractional N frequency divider having an input connected to an output of the voltage controlled signal source and providing an output;
- a phase detector having a first input connected to the output of the fractional N frequency divider, a second input, and an output connected to a phase control input of the voltage controlled signal source; and
- a first time base frequency reference connected to the second input of the phase detector;

a switch selectively connecting to the output of one of the phase locked loops to form the output of the signal synthesizer; and a controller for selectively controlling the switch over a defined range of frequencies provided from the output of the signal synthesizer so that a first one of the phase locked loops is connected for first frequencies of the range where boundary spurs do not occur, and a second one of the phase locked loops is connected for second frequencies of the range where boundary spurs would occur if the first phase locked loop were connected.

11. The phase locked loop system of claim 10, wherein the controller further controls the frequency division value provided by the fractional N frequency divider to prevent boundary spurs, the frequency division value having both a whole component (Nwhole) and a fractional component (Nfrac).

12. The phase locked loop system of claim 10, wherein the whole component (Nwhole) and the fractional component (Nfrac) are different values when the first and second time base frequency reference sources are used to provide the same output frequency provided from the signal synthesizer.

* * * * *